(12) United States Patent
Ko

(10) Patent No.: US 7,714,382 B2
(45) Date of Patent: May 11, 2010

(54) TRENCH GATE SEMICONDUCTOR WITH NPN JUNCTIONS BENEATH SHALLOW TRENCH ISOLATION STRUCTURES

(75) Inventor: Kwang-Young Ko, Bucheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/168,114

(22) Filed: Jul. 5, 2008

(65) Prior Publication Data

US 2009/0026536 A1 Jan. 29, 2009

(30) Foreign Application Priority Data

Jul. 25, 2007 (KR) .................... 10-2007-0074721

(51) Int. Cl.
*H01L 29/78* (2006.01)
*H01L 21/336* (2006.01)

(52) U.S. Cl. .............. 257/330; 257/E29.26; 438/270

(58) Field of Classification Search ............ 438/27; 257/330, E29.26

See application file for complete search history.

(56) References Cited

U.S. PATENT DOCUMENTS

2004/0014263 A1* 1/2004 Fujishima et al. ............ 438/193
2005/0116217 A1* 6/2005 Jones et al. .................... 257/19

* cited by examiner

*Primary Examiner*—Matthew Smith
*Assistant Examiner*—Walter H Swanson
(74) *Attorney, Agent, or Firm*—Sherr & Vaughn, PLLC

(57) ABSTRACT

A trench gate semiconductor device, which is capable of securing a sufficient margin for a photo process while achieving an enhancement in gate-source leakage characteristics, is disclosed. Embodiments relate to a trench gate semiconductor device including an oxide film buffer filling a trench in an upper surface of an epitaxial layer over a semiconductor substrate; a gate poly formed in a gate trench, the gate trench extending from the oxide film buffer to the epitaxial layer; NPN junctions formed beneath the oxide film buffer at opposite sides of the gate poly; and poly plugs to electrically connect P type portions of the NPN junctions to upper metal electrodes.

10 Claims, 11 Drawing Sheets

TRENCH GATE SEMICONDUCTOR WITH NPN JUNCTIONS BENEATH SHALLOW TRENCH ISOLATION STRUCTURES

The present application claims priority under 35 U.S.C. 119 to Korean Patent Application No. 10-2007-0074721, (filed on Jul. 25, 2007), which is hereby incorporated by reference in its entirety.

BACKGROUND

Figure 1:
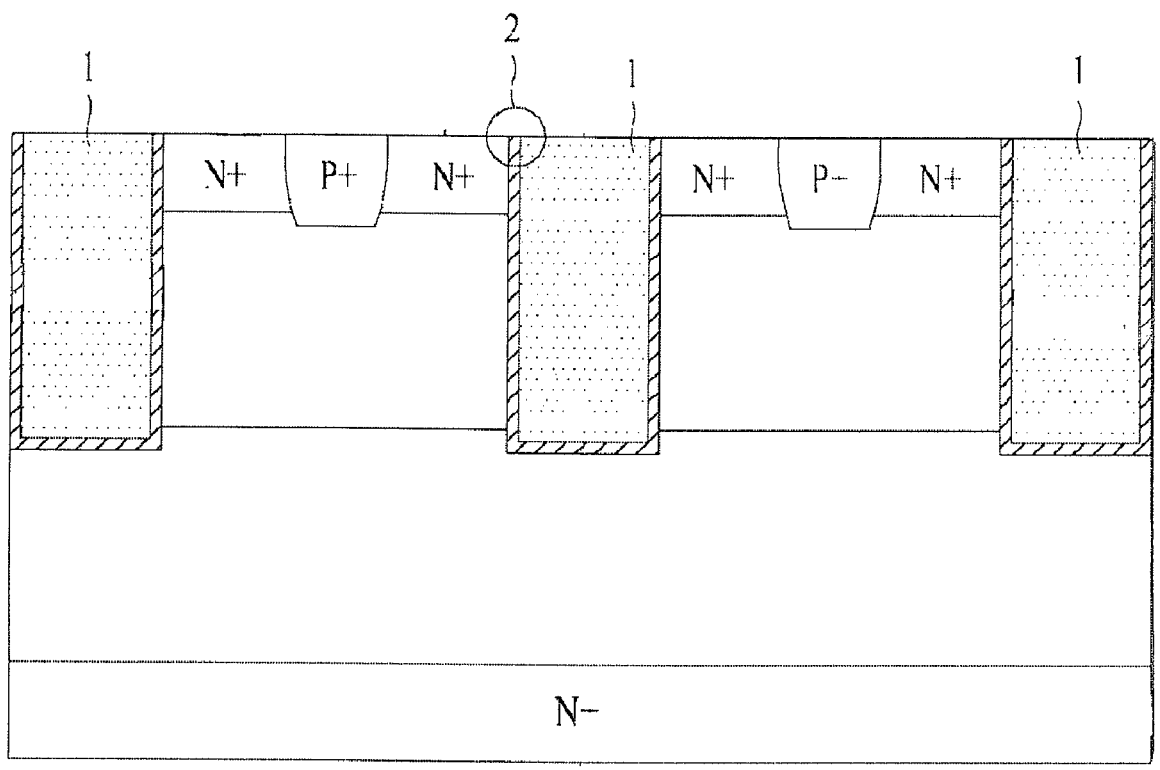
Figure 2:
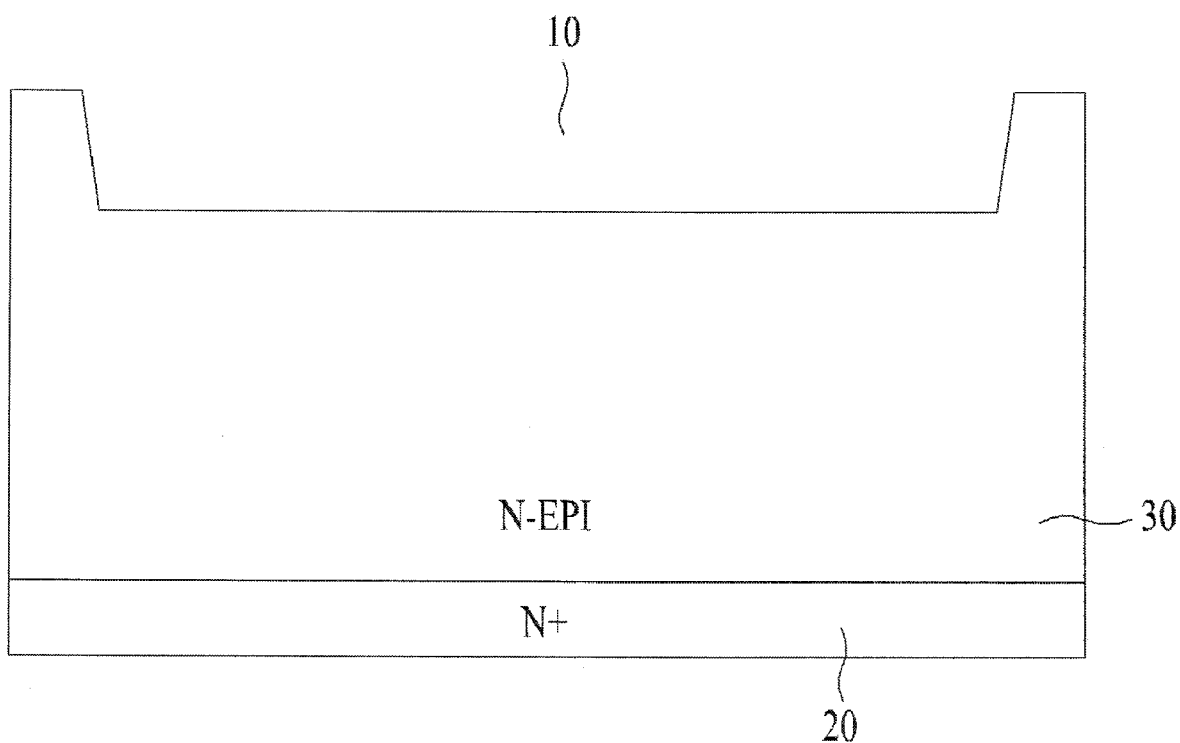
Figure 3:
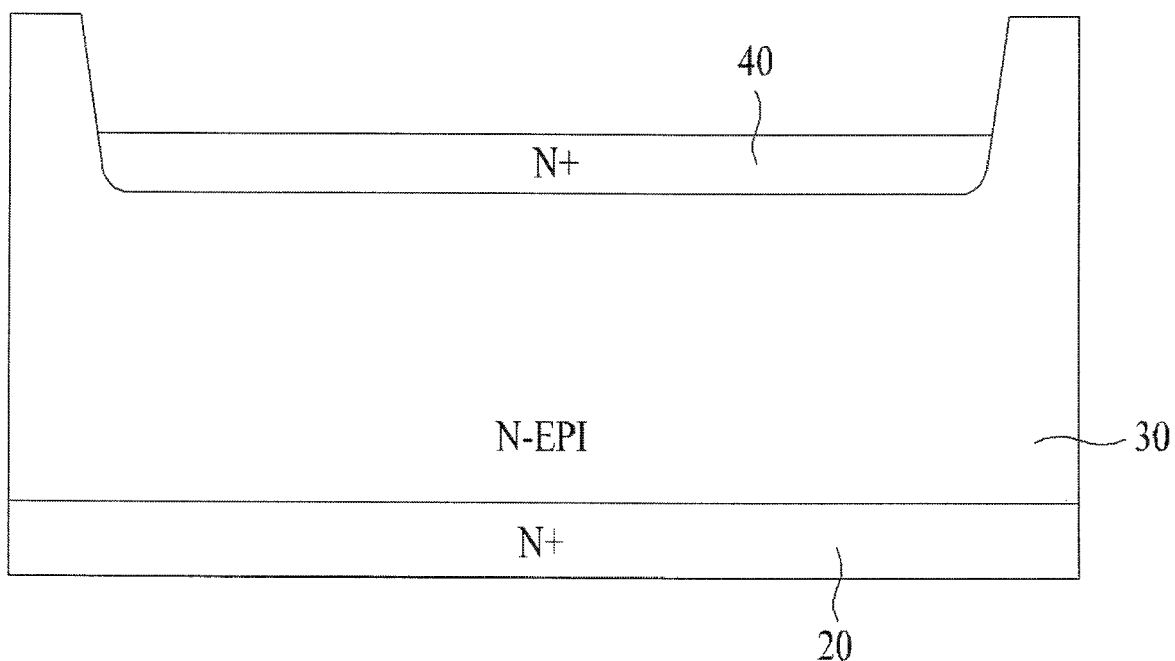

In a trench gate metal-oxide-silicon field-effect transistor (MOSFET), which is a kind of a trench gate semiconductor device, a gate is placed in a trench formed on a semiconductor device. FIG. 1 is a sectional view illustrating a MOSFET structure having a trench gate. As shown in FIG. 1, an insulating film is formed over inner surfaces of a plurality of trenches formed on a semiconductor substrate, and a gate poly 1 is deposited over the insulating film such that it fills the trenches. Thus, trench gates are formed.

An etchback or chemical mechanical polishing (CMP) process is carried out after the deposition of the gate poly 1 in the trenches, in order to planarize the entire upper surface of the resulting structure. However, the process used for planarization, for example, the etchback process, may increase a possibility that a gate oxide film positioned is attacked at the top of each trench gate in a region indicated by a circle 2 in FIG. 1. Degraded gate-source leakage characteristics may result.

Furthermore, in related cases, the trench gates have a limited spacing, in order to secure a sufficient margin for a photo process to form source electrodes. For this reason, it is difficult to fabricate a semiconductor device having a small cell pitch.

SUMMARY

Embodiments relate to a semiconductor device, and more particularly, to a trench gate semiconductor device, in which a gate is formed in a trench formed on a semiconductor substrate, and a method for fabricating the same. Embodiments relate to a trench gate semiconductor device and a method for fabricating the same, which are capable of securing a sufficient margin for a photo process while achieving an enhancement in gate-source leakage characteristics.

Embodiments relate to a method for fabricating a trench gate semiconductor device including forming a trench in an upper surface of an epitaxial layer formed over a semiconductor substrate. N type impurity ions may be implanted into a bottom surface of the trench, to form a diffusion layer. To form a well, P-type impurity ions may be implanted into a region beneath the diffusion layer. To form an oxide film buffer, the trench may be filled with an oxide. An entire upper surface of the resulting structure obtained after the formation of the oxide film buffer may be planarized. To form a gate trench, the resulting structure obtained after the filling of the oxide may be etched from the oxide film buffer to the epitaxial layer, in a region where a gate will be formed. A gate poly may be formed in the gate trench.

NPN junctions may be formed beneath the oxide film buffer at opposite sides of the gate poly. To form the NPN junctions, the oxide film buffer and the diffusion layer may be etched in regions where the P type junctions will be formed at opposite sides of the gate poly, until the well is exposed, to form source trenches. Then P type impurity ions may be implanted into bottom surfaces of the source trenches, to form P type diffusion layers in the well.

Poly plugs may be formed to electrically connect P type portions of the NPN junctions to upper metal electrodes by filling the source trenches with polysilicon. The upper metal electrodes may be formed over the gate poly and over the poly plugs. A gate insulating film, for example an oxide film, may be formed over an inner surface of the gate trench, except for a region where the oxide film buffer is formed, before the formation of the gate poly in the gate trench. A drain may be formed by filling a sinker trench with a conductive material, and forming a drain electrode electrically connected to the conductive material formed in the sinker trench.

Thus, the resulting trench gate semiconductor device includes an oxide film buffer filling a trench in an upper surface of an epitaxial layer over a semiconductor substrate. A gate poly may be formed in a gate trench which extends from the oxide film buffer to the epitaxial layer. A gate insulating film, which may be an oxide layer, may be formed on the inner surface of the gate trench. NPN junctions may be formed beneath the oxide film buffer at opposite sides of the gate poly. The NPN junctions may include an N+ type diffusion layer formed beneath the oxide film buffer, and a P type well formed beneath the N+ type diffusion layer.

Poly plugs electrically connect P type portions of the NPN junctions to upper metal electrodes. An interlayer insulating film may be formed over the oxide film buffer. Upper metal electrodes may include a gate electrode, a drain electrode, and a source electrode. The drain electrode may be connected to a conductive material formed in a sinker trench. The device may have a shallow trench isolation structure, and the oxide film buffer may include an STI oxide film.

DRAWINGS

FIG. 1 is a sectional view illustrating a metal-oxide-silicon field-effect transistor (MOSFET) structure having a trench gate.

Example FIGS. 2 to 9 are sectional views illustrating sequential processes of a method for fabricating a semiconductor device having a trench gate in accordance with embodiments.

Figure 10:
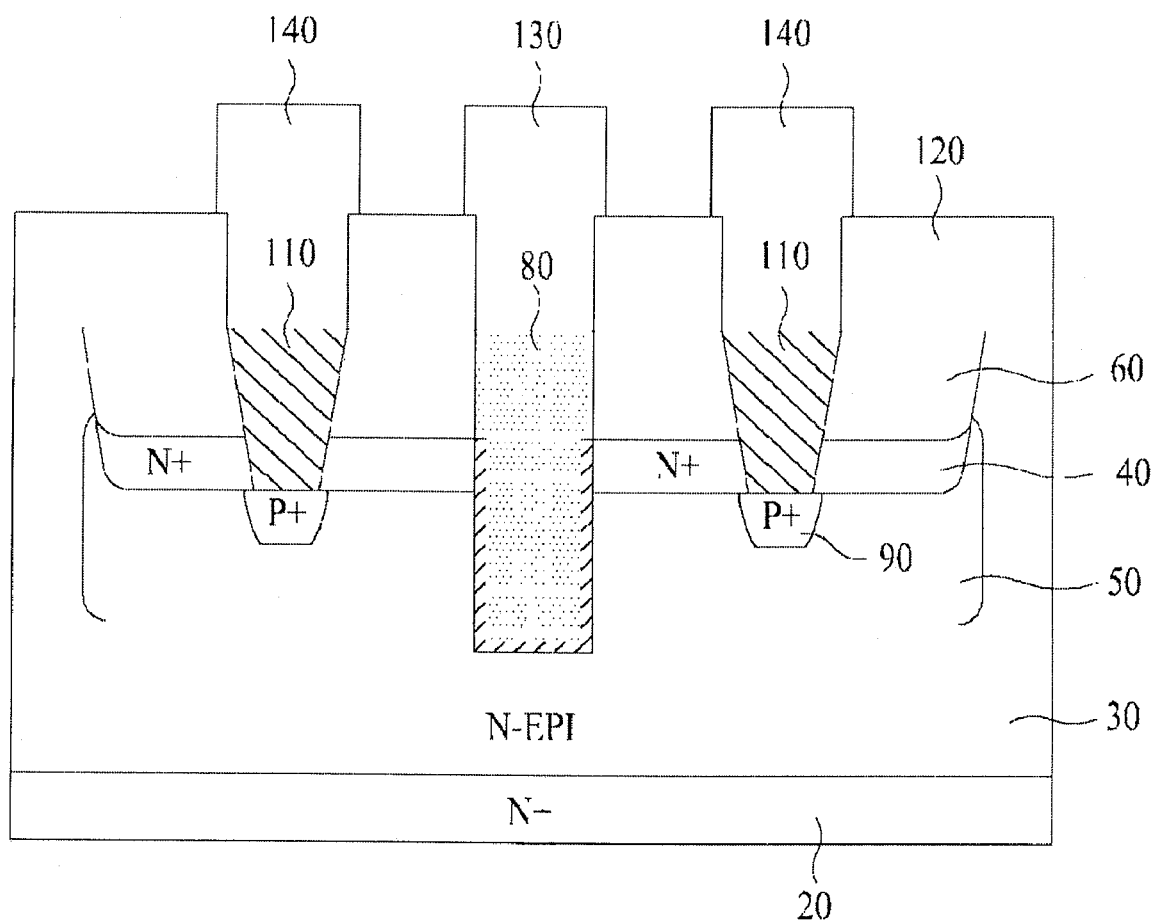

Example FIG. 10 is a sectional view illustrating a semiconductor device structure having a trench gate according to embodiments.

Figure 11:
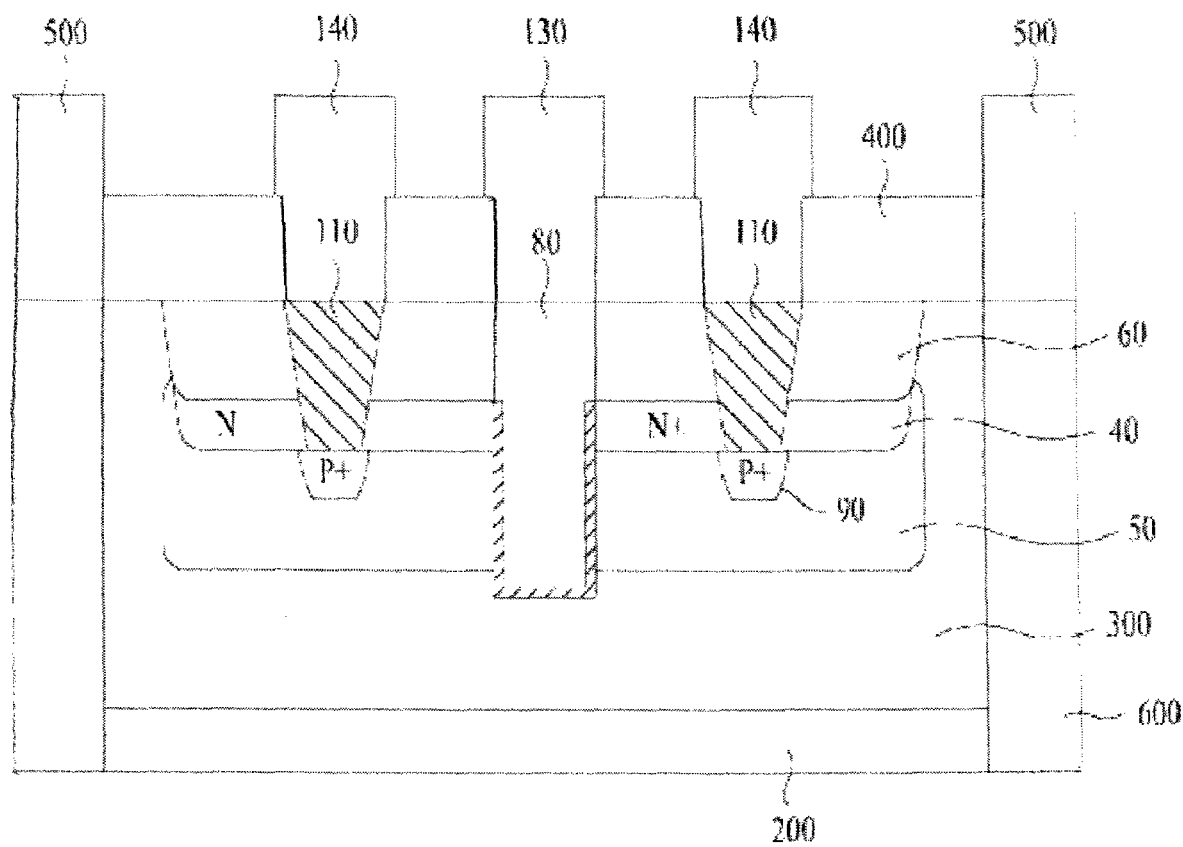

Example FIG. 11 is a sectional view illustrating a semiconductor device structure having a trench gate according to embodiments.

DESCRIPTION

Example FIGS. 2 to 9 are sectional views illustrating sequential processes of a method for fabricating a semiconductor device having a trench gate in accordance with embodiments. Example FIG. 10 is a sectional view illustrating a semiconductor device structure having a trench gate according to embodiments. In the following description, embodiments will be described in conjunction with, for example, a gate metal-oxide-silicon field-effect transistor (MOSFET) having a trench gate, namely, a trench gate MOSFET.

To fabricate the trench gate MOSFET according to embodiments, an N-epitaxial (N-EPI) layer 30 may be formed over an N+ type semiconductor substrate 20. As shown in example FIG. 2, the N-EPI layer 30 formed over the semiconductor substrate 20 may then be etched to a certain depth, to form a trench 10. As shown in example FIG. 3, N+ type impurity ions may be implanted into a bottom surface of the trench 10 to form an N+ type diffusion layer 40.

Figure 4:
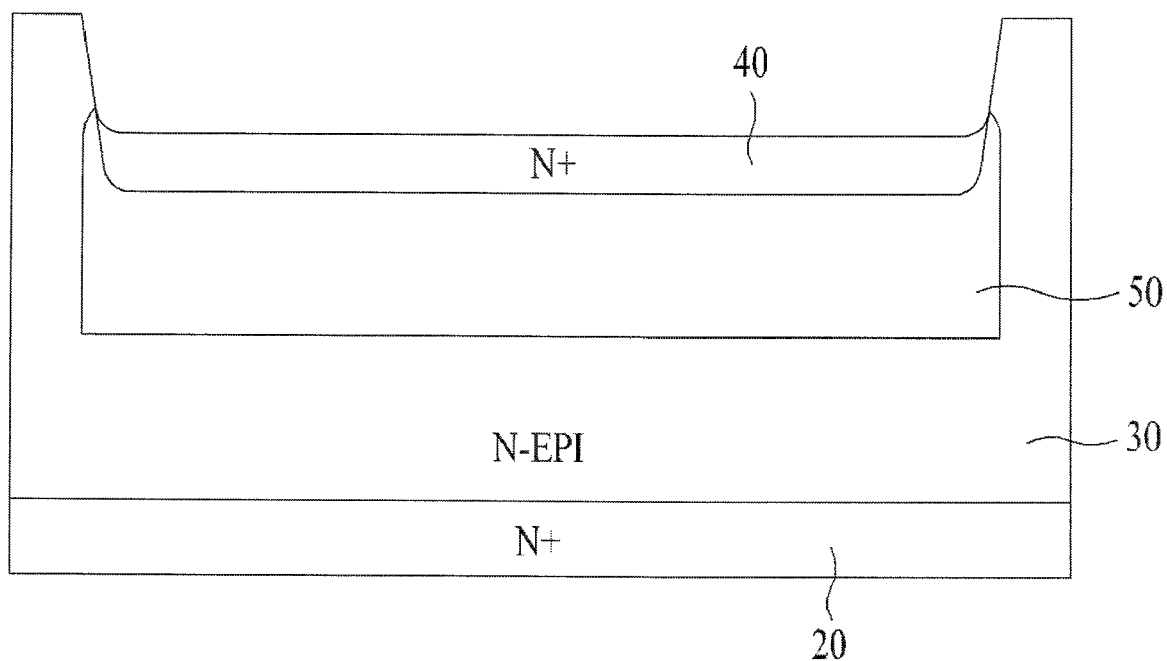
Figure 5:
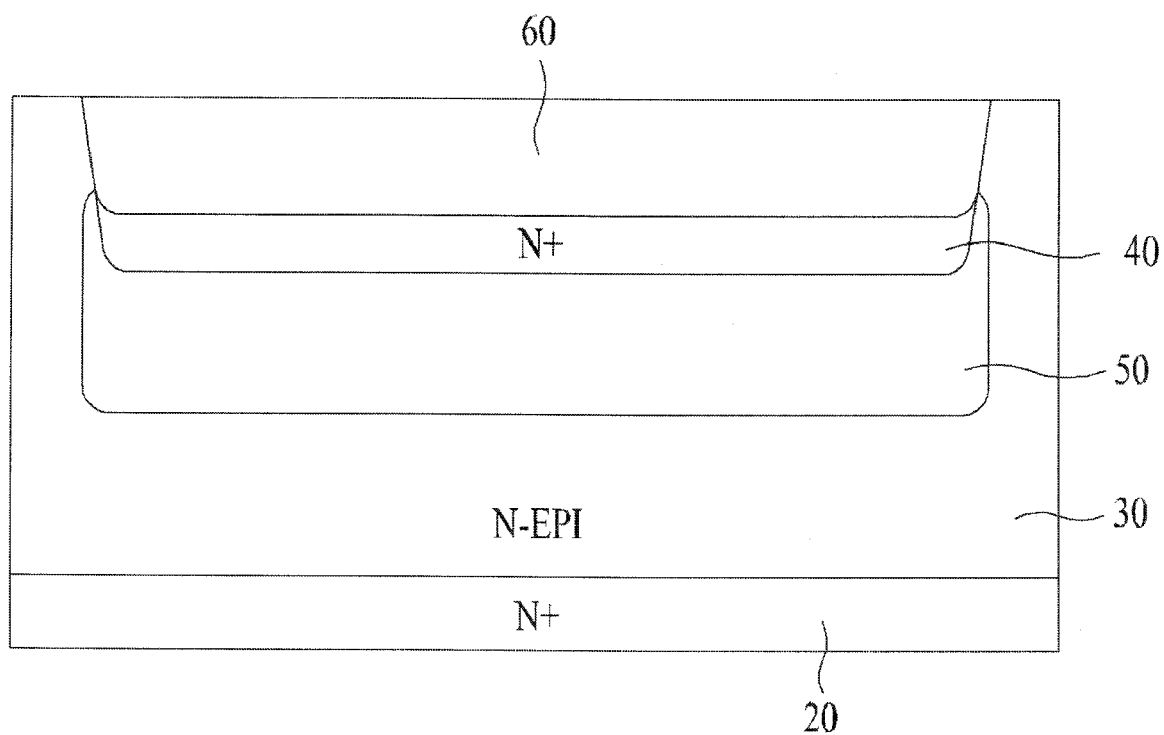

A P-well 50 may be formed in a region beneath the N+ type diffusion layer 40, as shown in example FIG. 4. The formation of the P-well 50 may be achieved by implanting P type impurity ions into the N-EPI layer 30, and diffusing the implanted ions. As shown in example FIG. 5, an oxide may fill in the trench 10, to form an oxide film buffer 60. The entire upper surface of the resulting structure may be planarized through a planarization process such as a chemical mechanical polishing (CMP) process, after the formation of the oxide film buffer 60.

Figure 6:
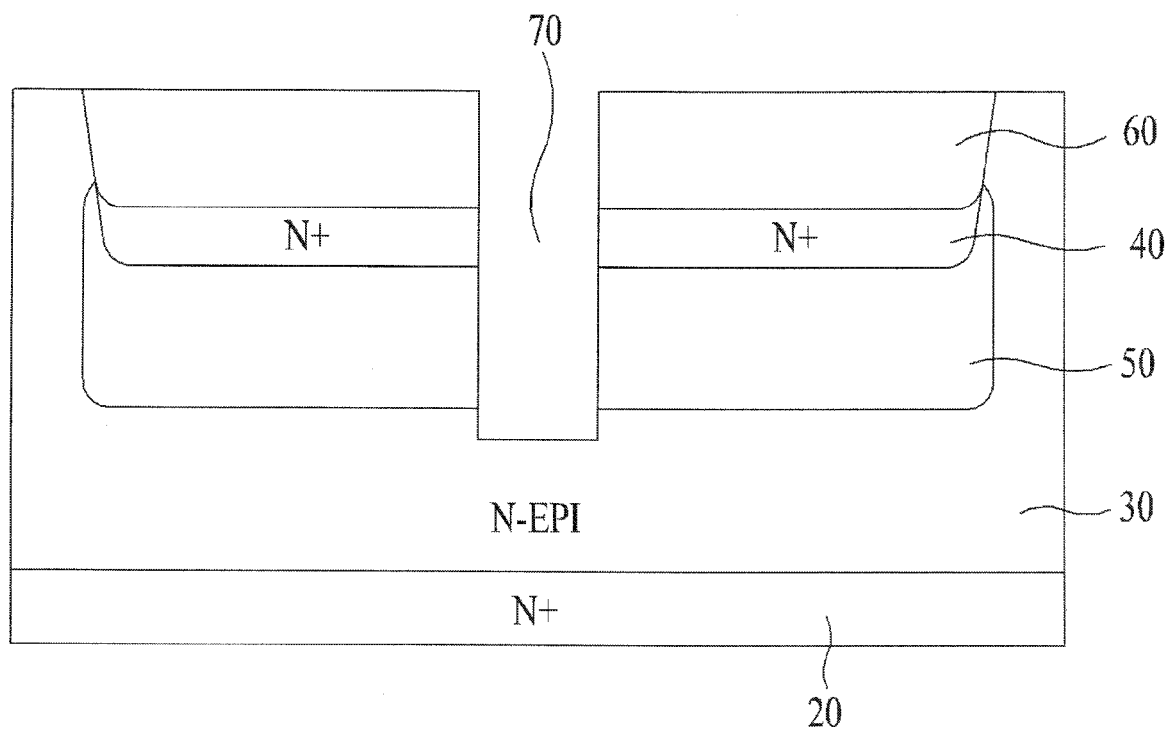

An etching process may be carried out using a photoresist pattern to form a gate, as shown in example FIG. 6. That is, an active region, where a gate is to be formed, may be etched to a certain depth, width and length to form a gate trench 70. The gate trench 70 may be formed by etching below the depth of the P-well 50. That is, the gate trench 70 may be deeper than the boundary between the P-well 50 and the N-EPI layer 30.

Figure 7:
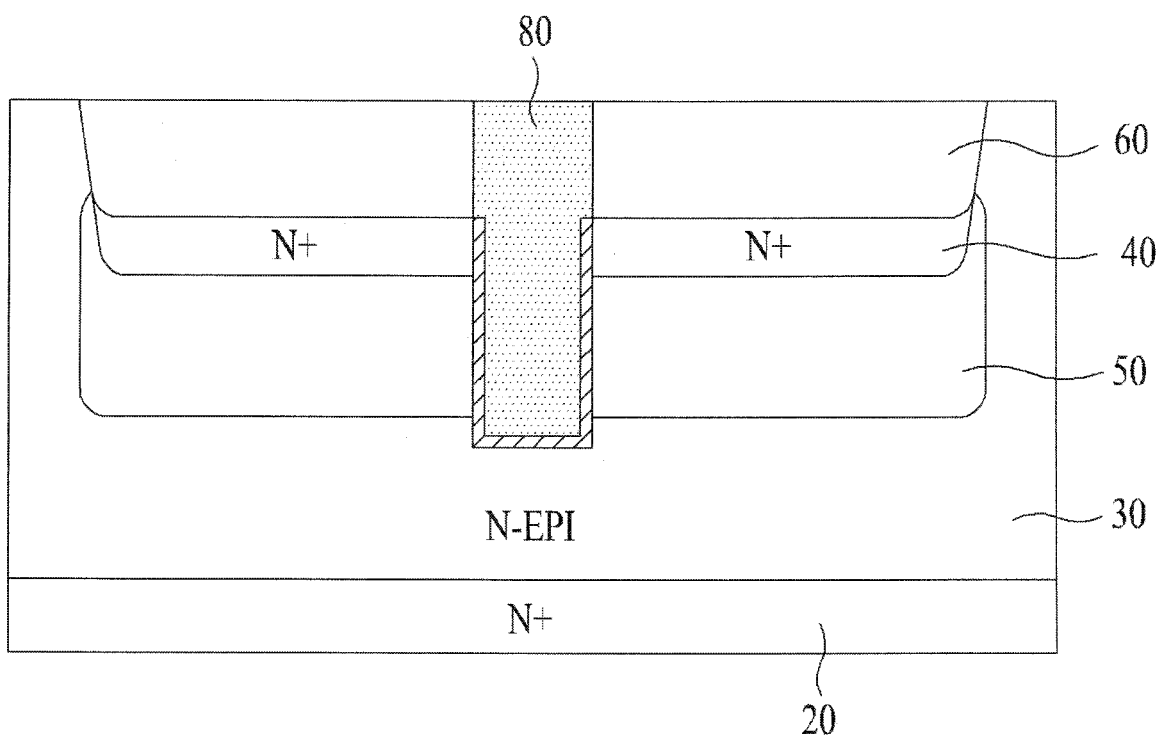

As shown in example FIG. 7, a gate insulating film may be formed over an inner surface of the gate trench 70. Poly (polysilicon) may fill in the gate trench 70, to form a gate poly 80. For example, the gate insulating film may be formed in the gate trench 70, using a thermal oxidation process, and polysilicon may be deposited to a sufficient thickness to fill the gate trench 70. After the deposition of the polysilicon, a planarization process may be carried out to remove the polysilicon from a region outside the gate trench 70. The gate insulating film may be formed over the inner surface of the gate trench 70, except for a region where the oxide film buffer 60 is formed. The gate insulating film may include an oxide film formed by a deposition process.

Figure 8:
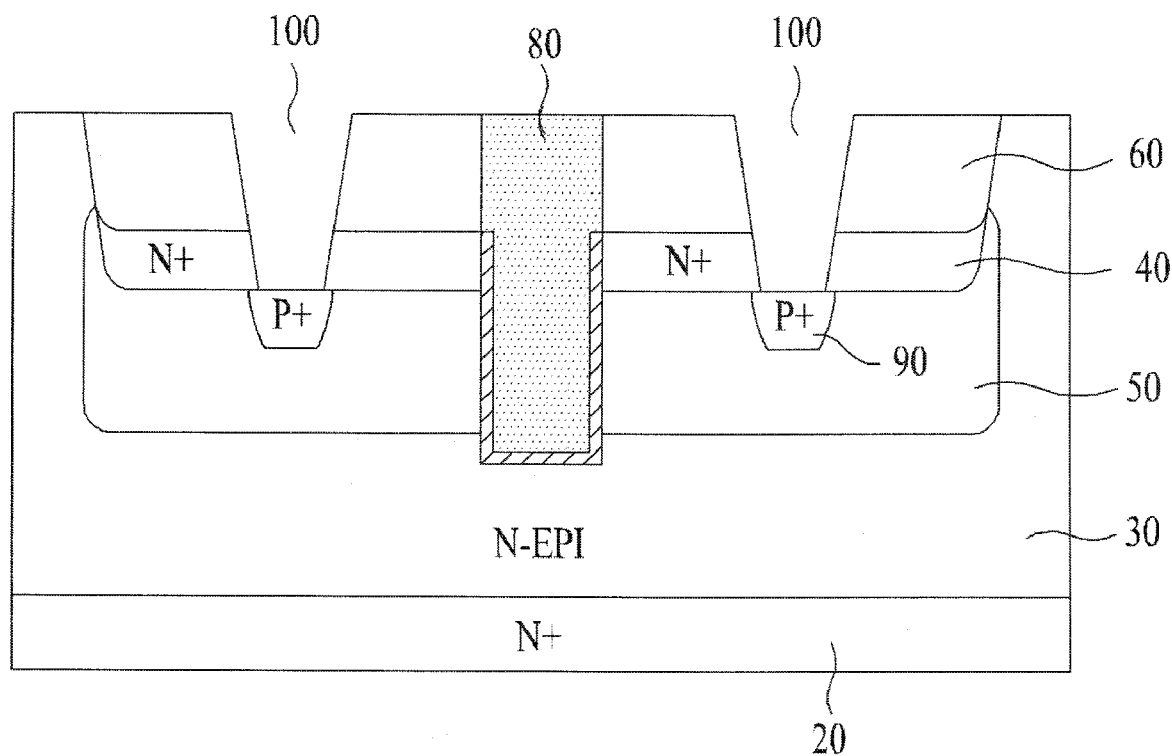
Figure 9:
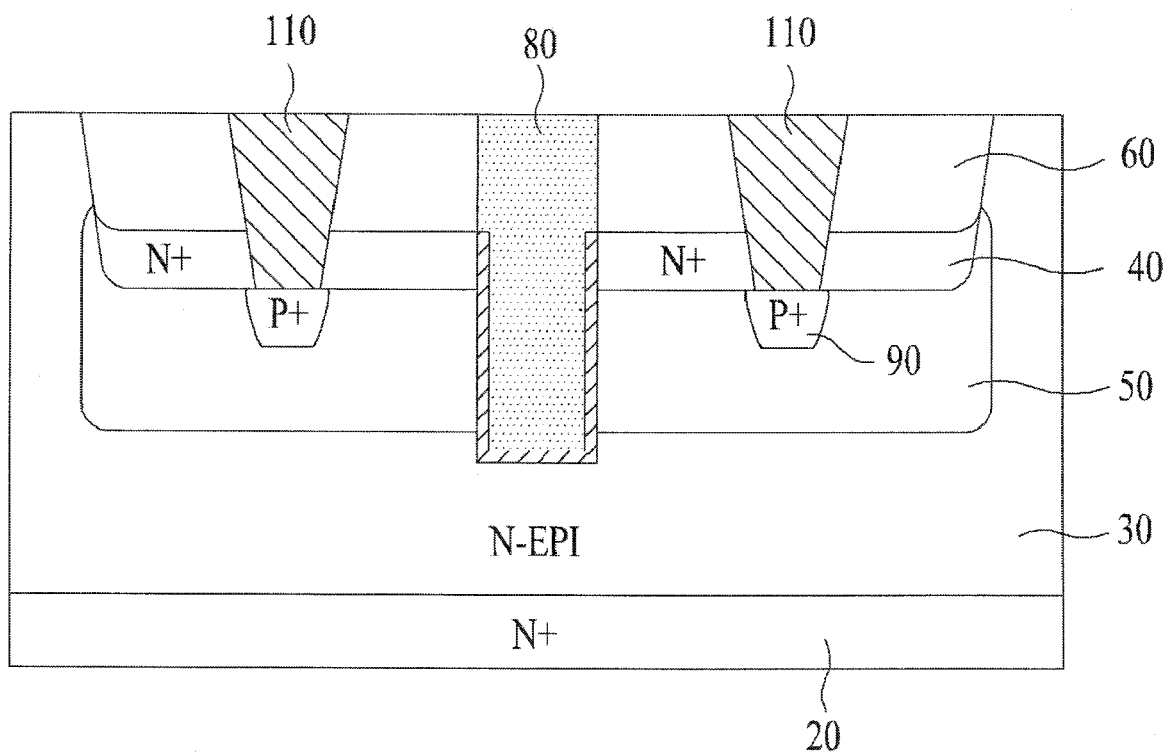

After formation of the gate poly 80 in the gate trench 70 as described above, P+ type junctions 90 may be formed in the P-well 50 at opposite sides of the gate poly 80, respectively, as shown in example FIG. 8. To form the P+ type junctions 90, an etching process may be conducted to a certain depth in regions where the P+ type junctions 90 will be formed at opposite sides of the gate poly 80, thereby forming source trenches 100. The etching depth of each source trench 100 reaches the N+ type diffusion layer 40. That is, the oxide film buffer 60 and N+ type diffusion layer 40 may be etched until the P-well 50 is exposed to form the source trenches 100.

After the formation of the source trenches 100, P+ type impurity ions may be implanted into bottom surfaces of the source trenches 100, to form P+ type diffusion layers, namely, P+ type junctions 90. After the formation of the P+ type diffusion layers, polysilicon may fill in the trenches 100, to form poly plugs 110, as shown in example FIG. 9. Poly plugs 110 allow the P+ type junctions 90 to be electrically connected to source electrodes 140, which will be subsequently formed. After the source trenches 100 are filled with polysilicon, a planarization process may selectively remove the polysilicon from a region outside the source trenches 100.

An interlayer insulating film 120 may be formed over the entire upper surface of the resulting structure. Metal electrodes 130 and 140 may be formed over the interlayer insulating film 120. The interlayer insulating film 120 may be made of a pre-metal dielectric (PMD) material.

As described above, in accordance with embodiments, the oxide film buffer 60, which has a buffering function, may be used to achieve an enhancement in gate-source leakage characteristics. Accordingly, attacks on the gate oxide film placed over the top of the trench gate may be reduced or eliminated.

A semiconductor device, which has a trench gate formed through the above-described processes in accordance with embodiments, is illustrated in example FIG. 10. As shown in example FIG. 10, the semiconductor device includes the N-EPI layer 30 formed over the semiconductor substrate 20.

The N-EPI layer 30 may be etched to a certain depth, width, and length, to form trench 10. The semiconductor device includes the oxide film buffer 60, which may be formed as an oxide filling in the trench 10. That is, the semiconductor device includes the oxide film buffer 60, filling trench 10, formed on the upper surface of the N-EPI layer 30.

The semiconductor device also includes the N type diffusion layer 40 arranged beneath the oxide film buffer 60. The formation of the N type diffusion layer 40 may be achieved by implantation of N type impurity ions. The N type diffusion layer 40 may be subsequently used to form N type junctions in NPN type junction structures.

The semiconductor device includes gate poly 80, which extends upwardly to the oxide film buffer 60, and NPN type junction structures formed at opposite sides of the gate poly 80. In each NPN type junction structure, an N type junction may be formed to be directly in contact with the lower surface of the oxide film buffer 60. However, each P type junction 90 is not formed between the N type junctions, but formed in the P-well 50 in a region defined below and between the N type junctions. Thus, the semiconductor device includes poly plugs 110, which electrically connect the P type junctions 90 with the source electrodes arranged above the P type junctions 90. The gate poly 80 may be formed with an upper surface flush with the oxide film buffer 60. In the region where the oxide film buffer 60 is arranged, there is no gate insulating film surrounding the gate poly 80.

Example FIG. 11 is a sectional view illustrating a semiconductor device structure having a trench gate according to embodiments. Example FIG. 11 illustrates an example in which a shallow trench isolation (STI) oxide film is used as an oxide film buffer in a semiconductor device using an STI structure.

To form the trench gate MOSFET according to the embodiment of example FIG. 11, an N+ type buried layer 200 may be formed over a semiconductor substrate. A deep N-well 300 may be formed in the N+ type buried layer 200. The deep N-well 300 formed in the semiconductor substrate may be etched to a certain depth, width, and length to form a trench. N+ type impurity ions may be implanted into a bottom surface of the trench, to form an N+ type diffusion layer 40.

A P-well 50 may be formed in the deep N-well 300 beneath the N+ type diffusion layer 40. The P-well 50 may be formed by implanting P type impurity ions into the N-well 300, and diffusing the implanted impurity ions. An oxide may fill in the trench to form an oxide film buffer 60. The oxide film buffer 60 may include an STI oxide film. The entire upper surface of the resulting structure may be planarized through a planarization process such as a CMP process, after the formation of the oxide film buffer 60.

An etching process may be carried out using a photoresist pattern, to form a gate, as in other embodiments. That is, an active region, where a gate is to be formed, may be etched to a below the depth of the P-well 50, to form a gate trench. Thereafter, a gate insulating film may be formed over an inner surface of the gate trench. Poly (polysilicon) may fill in the gate trench, to form gate poly 80.

For example, the gate insulating film may be formed in the gate trench, using a thermal oxidation process, and polysilicon may be deposited to a sufficient thickness to fill the gate trench. After the deposition of the polysilicon, a planarization process may remove the polysilicon from a region outside the gate trench. The gate insulating film may be formed over the inner surface of the gate trench, except for a region where the oxide film buffer 60 is formed. The gate insulating film may include an oxide film formed by a deposition process.

After the formation of the gate poly 80 in the gate trench, NPN junction structures at opposite sides of the gate poly 80 may be formed. P+ type impurity ions may be implanted into source trenches formed by etching, to a certain depth, the region where P+ type junctions 90 will be formed, thereby forming P+ type diffusion layers, namely, the P+ type junctions 90. Polysilicon may fill in the source trenches, to form poly plugs 110. An interlayer insulating film 400 may be formed over the entire upper surface of the resulting structure. Metal electrodes 130 and 140 may be formed over the interlayer insulating film 400. These processes may be carried out in the same manner as in previous embodiments described in conjunction with example FIGS. 2 to 10, so no detailed description thereof will be given.

In embodiments, a drain electrode 500 may be formed simultaneously with the metal electrodes 130 and 140 including the gate electrode and source electrodes. A conductive material may fill an N+ type sinker trench beneath the drain electrode 500, to form an N+ type sinker 600. The N+ type sinker 600 functions to electrically connect the drain electrode 500 to the semiconductor substrate near the lower surface of the N+ type sinker 600.

As apparent from the above description, in accordance with embodiments, an oxide film buffer may be used to reduce the possibility that the gate oxide film placed over the top of the trench gate is attacked. Accordingly, it may be possible to enhance gate-source leakage characteristics, and thus to achieve an enhancement in the throughput of the semiconductor device. In accordance with embodiments, it is possible to secure a sufficient margin for a photo process to form a source electrode, and thus to reduce the spacing between trench gates. Thus, it is possible to fabricate a semiconductor device having a higher cell density.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
    an oxide film buffer filling a trench in an upper surface of an epitaxial layer over a semiconductor substrate;
    a gate poly formed in a gate trench, the gate trench extending from the oxide film buffer to the epitaxial layer;
    NPN junctions formed beneath the oxide film buffer at opposite sides of the gate poly; and
    poly plugs to electrically connect P type portions of the NPN junctions to upper metal electrodes.

2. The apparatus of claim 1, wherein the apparatus has a shallow trench isolation structure, and the oxide film buffer is comprised of an STI oxide film.

3. The apparatus of claim 1, wherein the NPN junctions comprise an N+ type diffusion layer formed beneath the oxide film buffer.

4. The apparatus of claim 3, wherein the NPN junctions comprise a P type well formed beneath the N+ type diffusion layer.

5. The apparatus of claim 1, comprising a gate insulating film formed on the inner surface of the gate trench, except for a region where the oxide film buffer is formed.

6. The apparatus of claim 1, wherein the gate insulating film is an oxide layer.

7. The apparatus of claim 1, comprising an interlayer insulating film formed over the oxide film buffer.

8. The apparatus of claim 1, wherein the upper metal electrodes comprise a gate electrode and a source electrode.

9. The apparatus of claim 1, comprising a drain electrode.

10. The apparatus of claim 9, wherein the drain electrode is connected to a conductive material formed in a sinker trench.

* * * * *